United States Patent [19]
Johnson

[11] 4,123,704
[45] Oct. 31, 1978

[54] FREQUENCY DEVIATION DIGITAL DISPLAY CIRCUIT

[75] Inventor: Kenneth C. Johnson, Bountiful, Utah

[73] Assignee: Sperry Rand Corporation, New York, N.Y.

[21] Appl. No.: 873,449

[22] Filed: Jan. 30, 1978

[51] Int. Cl.² .................................................. G01R 23/02
[52] U.S. Cl. .............................. 324/78 Z; 324/78 D; 328/134
[58] Field of Search .................... 324/78 Z, 78 D, 187; 328/134; 235/92 TF, 92 FQ; 340/248 D, 253 Y

[56] References Cited
U.S. PATENT DOCUMENTS

| 3,882,303 | 5/1975 | Linder | 324/78 Z |
| 3,922,670 | 11/1975 | Shaw | 324/187 |
| 3,990,007 | 11/1976 | Hohhof | 324/78 D |

Primary Examiner—M. Tokar
Attorney, Agent, or Firm—John R. Flanagan; William E. Cleaver; Marshall M. Truex

[57] ABSTRACT

A circuit is provided for monitoring a signal generated by an oscillator and producing a digital display of the sign and magnitude of the deviation of the actual frequency of the oscillator-generated signal from a preselected desired frequency. Alternating sampling and display period pulses are produced in the circuit and, during the period of a sampling pulse, clock pulses are produced at a rate proportional to the actual frequency of the oscillator-generated signal. A plurality of counters in the circuit count the number of clock pulses produced during the period of a sampling pulse and hold the count during the period of a display pulse succeeding the sampling pulse. Read only memory devices sense the count held by the counters and decode the count to drive display units either to display the magnitude and sign of the deviation when it is within a predetermined range or to display an out-of-range indication.

9 Claims, 3 Drawing Figures

{ 4,123,704 }

FREQUENCY DEVIATION DIGITAL DISPLAY CIRCUIT

BACKGROUND OF THE INVENTION

1. Field of the Invention

The present invention broadly relates to the field of frequency detection and, more particularly, is concerned with a circuit for monitoring a signal generated by an oscillator or the like and producing a digital display of the sign and magnitude of the deviation of the actual frequency of the signal from a preselected desired frequency when the deviation is within a predetermined range or otherwise a display of an out-of-range indication.

2. Description of the Prior Art

In many electronic systems using an oscillator or the like for generating a signal at a desired center frequency, it is oftentimes desirable to continuously monitor the frequency of the signal during operation of the system in order to be able to take immediate corrective action should out-of-tolerance deviations in the actual frequency of the oscillator signal from the desired frequency occur.

One prior art detector disclosed in U.S. Pat. No. 3,990,007 is adapted to monitor a signal and provide an indication of whether its frequency is above, below or within a given tolerance range of a predetermined frequency. However, no provision is made for determining nor digitally displaying the magnitude of deviation of the monitored signal's frequency from the predetermined frequency. Consequently, this prior art detector would be of little assistance to the operator in taking steps to fine tune the oscillator of the system when the need for corrective adjustment becomes apparent.

SUMMARY OF THE INVENTION

The present invention substantially overcomes the above-mentioned disadvantages of the cited prior art detector by providing a simple and economical circuit for monitoring a signal and providing a quick and accurate digital display of the magnitude and sign of a deviation in the actual frequency of the signal from a preselected desired frequency. The circuit enhances the trouble shooting capabilities of an operator by facilitating immediate decisions as to whether the deviation in the signal frequency is acceptable or requires corrective action. Through visual display of the magnitude and sign of the deviation, the operator can readily discern whether the deviation is relatively constant and thus within operating tolerance, or increasing slowly which would warn of an approaching problem. Also, the circuit provides for display of an out-of-range or tolerance indication which might mean that replacement of the oscillator or shutdown of the system is required.

Accordingly, the present invention broadly relates to a circuit for producing a digital display of the deviation of the actual frequency of an input signal from a preselected desired frequency. The circuit has means for producing alternating sample and display period pulses and means for receiving the input signal and the sampling and display pulses for producing, during the period of a sampling pulse, clock pulses at a rate proportional to the actual frequency of the incoming signal. Counter means are provided for receiving the clock pulses and counting the number thereof produced during the period of a sampling pulse. The counter means is operable to hold the count during the period of a display pulse following the sampling pulse period. The circuit also has digital display means and sensing means for sensing the count held by the counter means and decoding the same to drive the display means to digitally indicate, when within a predetermined range, the magnitude of deviation of the actual frequency of the incoming signal from the preselected desired frequency.

Also, the means for sensing and decoding the count held by the counter means is operable to drive the display means to indicate whether the magnitude of the deviation of the actual frequency is positive or negative relative to the preselected frequency. Further, such means is operable to cause the display of an out-of-range indication when the magnitude of deviation is outside of the predetermined range.

More specifically, the count sensing and decoding means includes a plurality of read only memory devices for sensing and decoding separate portions of the count held by the counter means. One of the memory devices decodes a portion of the count so as to determine the sign of the deviation magnitude and other of the memory devices are responsive to the sign determined by the one device so as to decode their respective count portions in a first predetermined form if the sign is positive and in a second predetermined complementary form if the sign is negative. The digital display means includes a plurality of units. A first of the units is adapted to be driven to display a digit representing the hundredths decimal place number of the deviation magnitude. A second of the units is adapted to be driven to display a digit representing the tenths decimal place number of the deviation magnitude. A third of the units is adapted to be driven to display the sign of the deviation magnitude as well as a digit representing the ones unit, if any, of the deviation magnitude.

DETAILED DESCRIPTION OF THE INVENTION

THE INVENTION — IN GENERAL

Figure 1:
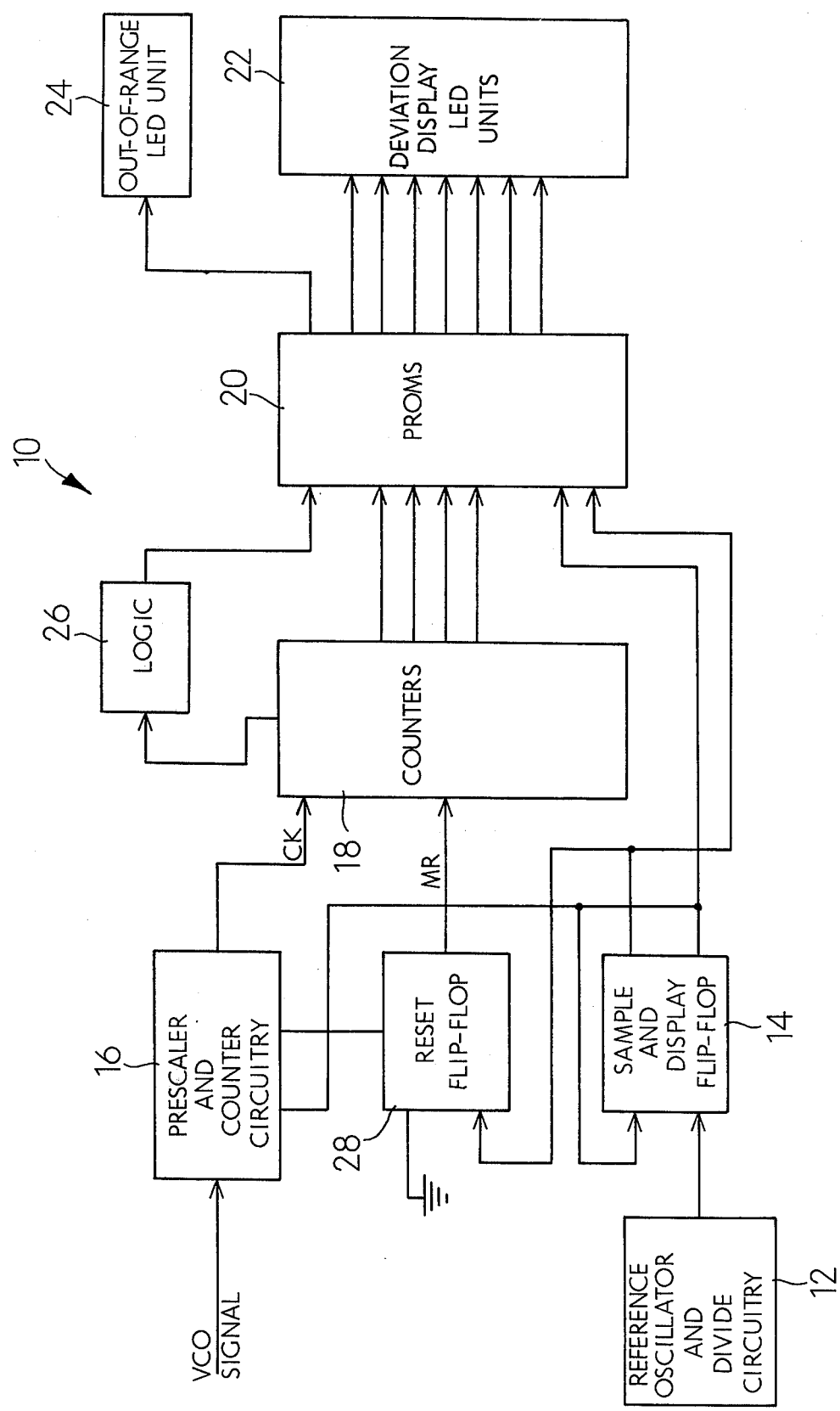
FIG. 1 is a block diagram representation of the frequency deviation digital display circuit of the present invention.

Referring to the drawings, and particularly to FIG. 1, there is shown the frequency deviation digital display circuit, generally designated 10, of the present invention in block diagram form. The circuit 10 is adapted to monitor the frequency of a signal generated by an oscillator or any other signal-generating device and digitally display the magnitude of deviation, within a predetermined range, of the actual frequency at which the oscillator is running from its preselected desired frequency.

In one exemplary application of the invention, the circuit receives the signal generated by a voltage controlled oscillator (not shown) which is adjusted to operate at a preselected desired frequency of 150 MHz. In that application, the circuit will digitally display frequency deviation magnitudes within ±1.99 MHz of the desired frequency. If the actual running frequency of the signal has deviated from the desired frequency by more than ±1.99 MHz, then the circuit 10 causes an out-of-range display to light. In the latter case, the circuit does not provide a display of the magnitude of deviation of the out-of-range condition or whether it is over or under range. While a frequency of 150 MHz and range of ±1.99 MHz will be used in connection with the detailed description of the circuit illustrated in FIGS. 2A and 2B, it should be understood that the present invention is not so limited.

Turning first to FIG. 1, the frequency deviation digital display circuit 10 generally includes reference oscillator and divide circuitry 12, a sample and display flip-flop 14, prescaler and counter circuitry 16, counter means 18, programmed read only memory devices (PROMS) 20, deviation display LED units 22, an out-of-range LED unit 24, a logic circuit 26 and a reset flip-flop 28.

The circuitry 12 and flip-flop 14 together function to produce alternating sampling and display period pulses. The circuitry 16 receives these pulses as well as an incoming signal from a voltage-controlled oscillator (VCO), not shown, the deviation in the frequency of which is to be monitored and displayed by the circuit 10. During the period of a sampling pulse, the circuitry 16 produces clock pulses CK at a rate proportional to the actual frequency of the incoming VCO signal.

Counter means 18 receives the clock pulses CK produced by the prescaler and counter circuitry 16 and counts the number thereof produced during the period of a sampling pulse. The counter means 18 is further operable to hold the count, reached at the termination of the sampling pulse period, during the succeeding display pulse period and until it receives a reset signal MR from the reset flip-flop 28 which will clear the count.

The read only memory devices 20 receive the sampling and display period pulses and sense, during the period of a display pulse, the count held by the counter means 18 which was reached by the latter at the end of the preceding sampling pulse period. The devices 20 decode the sensed count and drive the LED units 22 to display the magnitude and sign of the deviation of the actual frequency of the incoming VCO signal from the preselected desired frequency when the deviation magnitude is within a predetermined range. Alternatively when the deviation magnitude is outside of the predetermined range, one of the devices 20 drives the LED unit 24 to display an out-of-range indication. In the latter case, no indication is given of the magnitude or sign of the out-of-range deviation. During the period of a sampling pulse the devices 20, as well as the display units 22, 24 are disabled.

The logic circuit 26 of the circuit 10 cooperates with the read only memory devices 20 in causing the display of an out-of-range indication when the count of the counter means 18 exceeds the maximum positive magnitude of the frequency deviation allowed within the predetermined range.

PREFERRED EMBODIMENT OF THE INVENTION

Figure 2A:
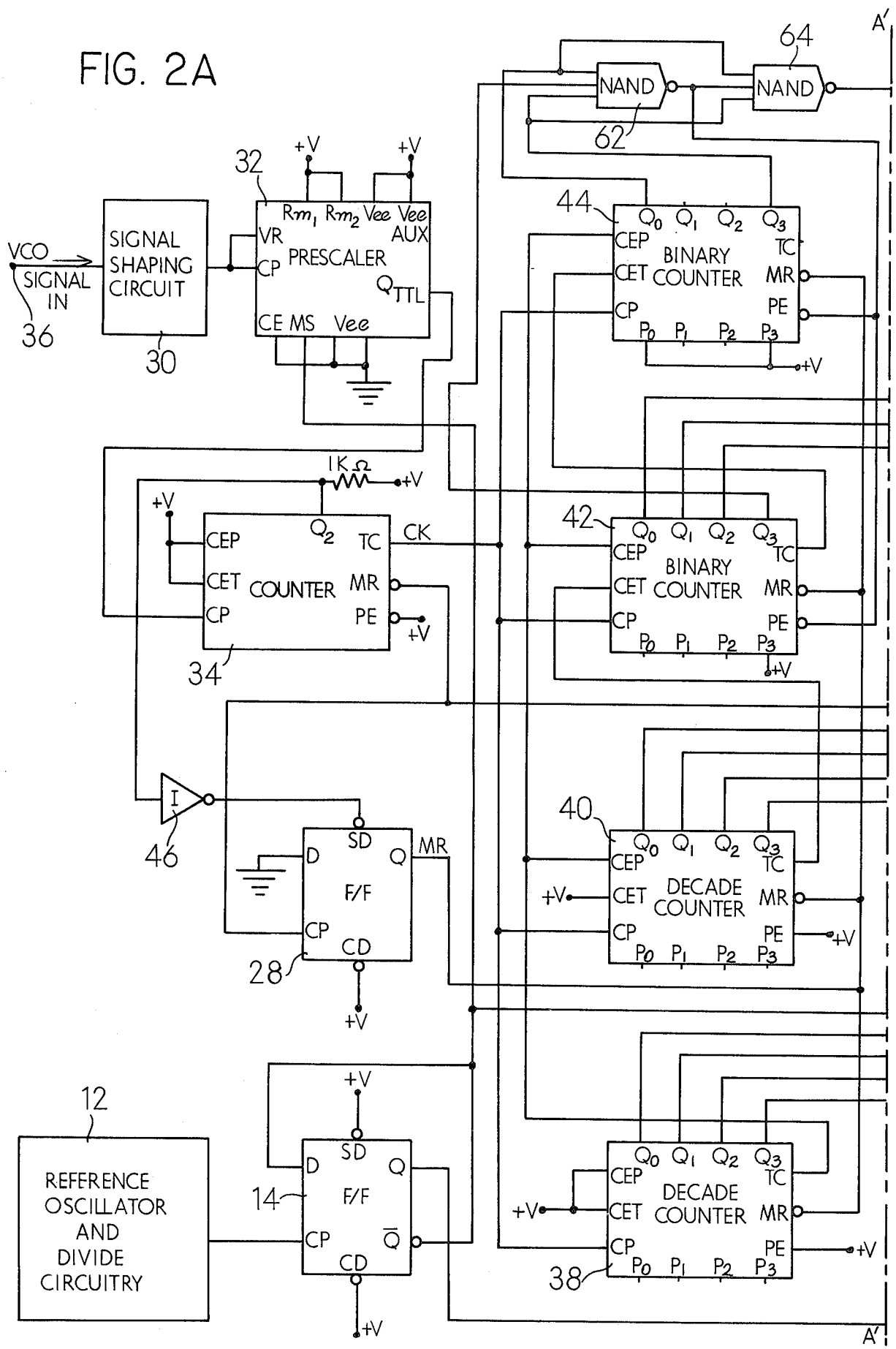
FIGS. 2A and 2B taken together provide a detailed electrical schematic diagram of the circuit of the present invention.
Figure 2B:
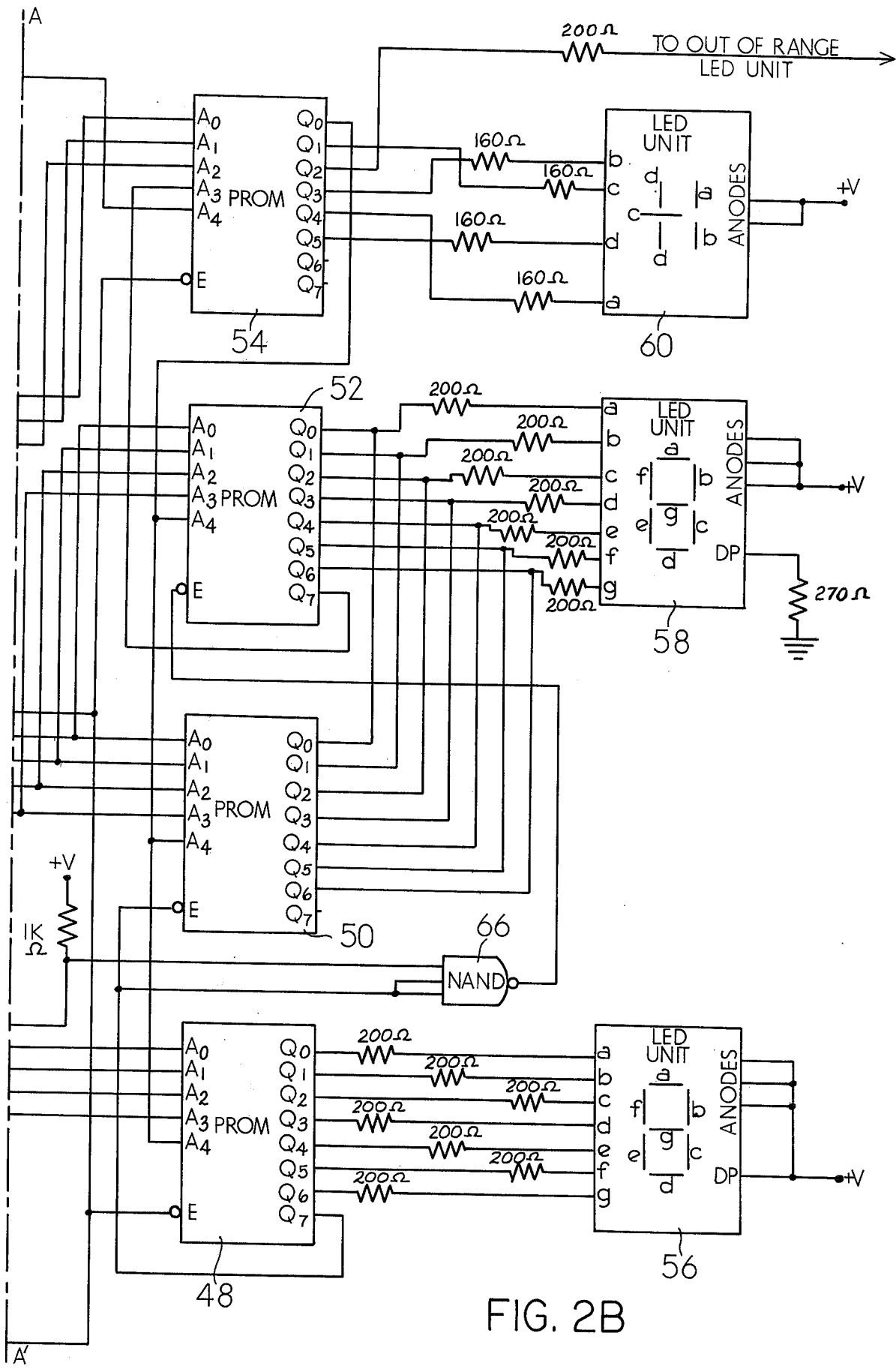

Turning now to FIGS. 2A and 2B which taken together illustrate the preferred form of the invention, the circuit 10 being depicted therein is constructed and arranged to digitally display frequency deviation magnitudes within a +1.99 MHz predetermined range of a desired preselected frequency of 150 MHz. Alternatively, the circuit 10 will cause the display of an out-of-range indication whenever the deviation magnitude is over or under that range.

The reference oscillator and divide circuitry 12 of the circuit 10 includes a 1.024 MHz crystal and circuitry associated therewith which divides the frequency of the crystal and output timing pulses to the CP input of the sample and display flip-flop 14 so as to cause the flip-flop 14 to toggle every sixteen milliseconds. In other words, complementary high and low states are produced at the Q and $\overline{Q}$ outputs of the flip-flop 14 every sixteen milliseconds through receipt of the timing pulses at its CP input to view that its $\overline{Q}$ output is coupled back to its D input. The high state at the Q output of the flip-flop 14 defines a sampling pulse having a sixteen millisecond period, while the high state at its $\overline{Q}$ output defines a display pulse having a sixteen millisecond period. Thus, during a sampling period the $\overline{Q}$ output will be low, while during a display period the Q output will be low. More particularly, a high at the Q output may be considered an enable sampling pulse (or disable display pulse) and the low at the $\overline{Q}$ output considered a disable display pulse (or an enable sampling pulse), while a low at the Q output may be considered a disable sampling pulse (or enable display pulse) and the high at the $\overline{Q}$ output considered an enable display pulse (or a disable sampling pulse).

The prescaler and counter circuitry 16 of FIG. 1 is formed by signal shaping circuit 30, prescaler 32 and counter 34 of FIG. 2A. The prescaler 32 receives the VCO-generated signal at its CP input from the terminal 36 of the VCO (not shown) after the signal has passed through the wave shaping circuit 30. The prescaler 32 is designed to perform a divide by ten operation on the incoming VCO signal. Therefore, during the period of an enable sampling pulse, when its reset input MR is low due to the $\overline{Q}$ output of the flip-flop 14 being low, the prescaler 32 outputs one TTL compatible pulse for each ten zero-positive crossings of the incoming VCO signal received during the sampling pulse period. For example, if the frequency of the incoming signal should be exactly 150 MHz, the desired preselected frequency, then $2.4 \times 10^6$ positive zero crossings of the VCO signal will be felt at the CP input of the prescaler 32 during a sampling pulse period of sixteen milliseconds. The prescaler 32, in turn, will produce at its $Q_{TTL}$ output $2.4 \times 10^5$ pulses during the sixteen millisecond sampling period.

The counter 34 of the circuitry 16 (FIG. 1) receives at its CP input the pulses produced at the $Q_{TTL}$ output of the prescaler 32. The counter 34 is designed to produce one clock pulse CK at its TC output for each sixteen prescaler-produced pulses received at its CP input. Thus, in the example given above where the frequency of the incoming signal to the prescaler 32 is exactly 150 MHz, the counter 34 will produce $1.5 \times 10^4$ clock pulses CK at its TC output in response to the receipt of $2.4 \times 10^5$ pulses at its CP input during each sampling period of sixteen milliseconds. It should also be noted that at the start of each sampling period, the counter 34 is enabled to begin counting upon its MR input going high due to the Q output of the flip-flop 14 going high.

The counter means 18 of FIG. 1 is comprised of decade counters 38 and 40 and binary counters 42 and 44, as seen in FIG. 2A, which during each sampling pulse period receive at their CP inputs the clock pulses CK outputted from the TC output of the counter 34 of the prescaler and counter circuitry 16. In the example given above where the counter 34 produces $1.5 \times 10^4$ clock pulses CK when the VCO signal frequency is exactly 150 MHz, the total count of the counters 38, 40, 42, 44 will reflect the number 15000, which is understood to be 150.00 MHz. Counter 38 gives the hundredths decimal place count in binary coded decimal form. Counter 40 gives the tenths decimal place count in binary coded decimal form. Counters 42 and 44 taken together give the ones, hundreds and thousands units decimal count in binary form.

More particularly, the TC output of each of the decade counters 38, 40 goes high when a binary count of nine, 1001, is reached on the $Q_0$ through $Q_3$ outputs thereof. Their TC outputs are low from a binary count of zero, 0000, through eight, 0001. Accordingly, a high on the TC output of the counter 38 places a high on the CEP input of the counter 40. Then, the next clock pulse CK (the tenth one) arriving at the CP input of the counter 40 will cause this counter to index one count; and, thus, for each ten clock pulses CK counted by the counter 38, one clock pulse CK is counted by counter 40. The CET and CEP inputs of the counter 42 are respectively connected to the TC outputs of the counters 40 and 38. Therefore, when the TC outputs of counters 40 and 38 both go high (upon reaching a binary count of nine, 1001, on each), the next clock pulse CK (the hundredth one) arriving at the CP input of the counter 42 will cause this counter to index one count. Consequently, for each one hundred clock pulses CK counted by counters 38 and 40, one clock pulse is counted by counter 42. And, since counter 42 initializes after sixteen counts, it will return to zero upon the arrival of the sixteen hundredth clock pulse. Finally, the CET and CEP inputs of the counter 44 are respectively connected to the TC outputs of the counters 42 and 38. Therefore, when the TC outputs of the latter go high upon counters 38 and 40 each reaching binary counts of nine and counter 42 being at a binary count of fifteen, 1111, on arrival of the fifteen hundred and ninety-ninth clock pulse, the next clock pulse (the sixteen hundredth one) arriving at the CP input of the counter 44 will cause this counter to index one count. Consequently, for each sixteen hundred clock pulses CK counted by the counters 42, 40 and 38, one clock pulse is counted by counter 44.

TABLE I which follows illustrates examples of the binary count of the counters 38, 40, 42 and 44 at various points during a sampling period and the frequency corresponding to the respective counts in terms of the number of clock pulses CK produced by the counter 34, wherein the decimal number, .01, represents the first clock pulse. Also, in TABLE I, a one (1) represents a high state on a respective counter Q output, while a zero (0) represents a low Q output state.

TABLE I

| Frequency (No. of CKs) | Counter 38 | | | | Counter 40 | | | | Counter 42 | | | | Counter 44 | | | |
|---|---|---|---|---|---|---|---|---|---|---|---|---|---|---|---|---|
| | $Q_0$ | $Q_1$ | $Q_2$ | $Q_3$ | $Q_0$ | $Q_1$ | $Q_2$ | $Q_3$ | $Q_0$ | $Q_1$ | $Q_2$ | $Q_3$ | $Q_0$ | $Q_1$ | $Q_2$ | $Q_3$ |
| .01 | 1 | 0 | 0 | 0 | 0 | 0 | 0 | 0 | 0 | 0 | 0 | 0 | 0 | 0 | 0 | 0 |
| .99 | 1 | 0 | 0 | 1 | 1 | 0 | 0 | 1 | 0 | 0 | 0 | 0 | 0 | 0 | 0 | 0 |
| 1.00 | 0 | 0 | 0 | 0 | 0 | 0 | 0 | 0 | 1 | 0 | 0 | 0 | 0 | 0 | 0 | 0 |
| 15.99 | 1 | 0 | 0 | 1 | 1 | 0 | 0 | 1 | 1 | 1 | 1 | 1 | 0 | 0 | 0 | 0 |
| 16.00 | 0 | 0 | 0 | 0 | 0 | 0 | 0 | 0 | 0 | 0 | 0 | 0 | 1 | 0 | 0 | 0 |
| 63.99 | 1 | 0 | 0 | 1 | 1 | 0 | 0 | 1 | 1 | 1 | 1 | 1 | 1 | 1 | 0 | 0 |
| 64.00 | 0 | 0 | 0 | 0 | 0 | 0 | 0 | 0 | 0 | 0 | 0 | 0 | 0 | 0 | 1 | 0 |
| 127.99 | 1 | 0 | 0 | 1 | 1 | 0 | 0 | 1 | 1 | 1 | 1 | 1 | 1 | 1 | 1 | 0 |
| 128.00 | 0 | 0 | 0 | 0 | 0 | 0 | 0 | 0 | 0 | 0 | 0 | 0 | 0 | 0 | 0 | 1 |
| 143.99 | 1 | 0 | 0 | 1 | 1 | 0 | 0 | 1 | 1 | 1 | 1 | 1 | 0 | 0 | 0 | 1 |
| 144.00 | 0 | 0 | 0 | 0 | 0 | 0 | 0 | 0 | 0 | 0 | 0 | 0 | 1 | 0 | 0 | 1 |
| 147.99 | 1 | 0 | 0 | 1 | 1 | 0 | 0 | 1 | 1 | 1 | 0 | 0 | 1 | 0 | 0 | 1 |
| 148.00 | 0 | 0 | 0 | 0 | 0 | 0 | 0 | 0 | 0 | 0 | 1 | 0 | 1 | 0 | 0 | 1 |
| 148.01 | 1 | 0 | 0 | 0 | 0 | 0 | 0 | 0 | 0 | 0 | 1 | 0 | 1 | 0 | 0 | 1 |
| 149.00 | 0 | 0 | 0 | 0 | 0 | 0 | 0 | 0 | 1 | 0 | 1 | 0 | 1 | 0 | 0 | 1 |
| 150.00 | 0 | 0 | 0 | 0 | 0 | 0 | 0 | 0 | 0 | 1 | 1 | 0 | 1 | 0 | 0 | 1 |
| 151.99 | 1 | 0 | 0 | 1 | 1 | 0 | 0 | 1 | 1 | 1 | 1 | 0 | 1 | 0 | 0 | 1 |
| 152.00 | 0 | 0 | 0 | 0 | 0 | 0 | 0 | 0 | 0 | 0 | 0 | 1 | 1 | 0 | 0 | 1 |
| | 1's | 2's | 4's | 8's | 1's | 2's | 4's | 8's | 1's | 2's | 4's | 8's | 16's | 32's | 64's | 128' |

All of the counters 38, 40, 42 and 44 will retain or hold their respective counts during each of the display periods which succeed respective sampling periods at the end of which the counts were reached. Clearing of the counts held by the counters occurs after the next sampling period has started and concurrently with the end of each of the display periods.

For resetting or clearing the counters, the Q output of the reset flip-flop 28 is connected to the MR input of each of the counters of counter means 18 (FIG. 1). The SD and CP inputs of reset flip-flop 28 sense the states of the $Q_2$ output of the counter 34 and the Q output of the flip-flop 14. As was explained above, at the start of a sampling pulse period, the Q output of the flip-flop 14 goes high and its $\overline{Q}$ output goes low, with the low $\overline{Q}$ output releasing the high clear on the MR input of prescaler 32 and allowing the latter to begin counting zero-positive crossings of the incoming VCO signal. Also, the low clear on the MR input of the counter 34 is removed (MR input goes high) when the Q output of the flip-flop 14 goes high, thereby allowing counter 34 to start counting when it receives pulses from the $Q_{TTL}$ output of the prescaler 32. Also, the low to high Q output transition of the flip-flop 14 is felt on the CP input of the reset flip-flop 28 and will enable transfer of a low state from the grounded D input to the Q output of the flip-flop 28. However, it is not until the counter 34 has counted up to four (its $Q_2$ output then goes high which is sensed as a low by the SD input of flip-flop 28 after inversion by an inverter 46) that the set low condition on the SD input of the flip-flop 28 is rendered active (goes low), allowing its Q output to go high which, in turn, is felt as a high at each of the MR inputs to the counters 38, 40, 42 and 44. The latter highs remove the clears on the counters and enable them for counting again. The counters will not receive the first clock pulse CK of the new sampling period until the counter 34 has counted sixteen prescaler-produced pulses, thus there is plenty of time for the counters to clear and get ready for the arrival of the first clock pulse even though they are being reset after the start of the new sampling period.

The programmed read only memory devices 20 of FIG. 1 are represented in FIG. 2B by PROM devices 48, 50, 52 and 54 which feel or sense at their A inputs the counts of the respective counters 38, 40, 42 and 44 as well as sense other signal states to be described hereinafter and decode the input states to drive the display units 22 and 24 in accordance with decoding programs contained within the PROM devices. In effect, the PROM devices function to read the counts reached by the counters at the end of a sampling period, compare them to the desired center frequency of the VCO signal of 150 MHz, and output drive signals corresponding to the deviation magnitude and sign from that center frequency within a range of ±1.99 MHz (in increments of 0.01) or output a signal which drives an out-of-range indication when the deviation magnitude is outside of that range.

The deviation display LED units 22 of FIG. 1 are comprised by units 56, 58 and 60, as depicted in FIG. 2B. The PROM device 48 drives the LED display unit 56 to display the hundredths decimal place number of the frequency deviation magnitude. Either the PROM device 50 or PROM device 52, as will be explained hereafter, drives the LED display unit 58 to display the tenths decimal place number of the deviation magnitude. The PROM device 54 drives the LED display unit 60 to display the + or − indication and a one (1) indication if the magnitude of the deviation is that large, or when the deviation magnitude is outside of the predetermined range, the device 54 drives the LED display unit 24 (FIG. 1) to display an out-of-range indication (causes the display unit 24 to light). In the case of the latter, the display units 56, 58 and 60 are disabled. Also, the PROM device 54 supplies a positive (+) or negative (−) sign indication to the PROM devices 48, 50 and 52 which affects the manner in which the PROM devices 48 and 50 will decode the count, which will be explained in detail hereinafter.

Before getting into a detailed explanation of the coordinated operation of all of the PROM devices 48, 50, 52 and 54 in sensing and decoding the count to drive the display units 56, 58 and 60 to display the frequency deviation when within the predetermined range, it would be desirable to first describe how an out-of-range deviation is detected and caused to be indicated by the lighting of the out-of-range display unit 24 (FIG. 1).

An out-of-range indication is brought about when the count reached during a sampling period is either greater than the number 15199 (meaning 151.99 MHz) or less than 14801 (meaning 148.01 MHz). Detection of an out-of-range condition where the count reached by the counters of counter means 18 (FIG. 1) indicates that the actual VCO signal frequency is either less than 144 MHz or greater than or equal to 152 MHz is achieved by logic circuitry 26 (FIG. 1) and the PROM device 54. However, should the VCO signal frequency fall within the range of equal to or greater than 144 MHz but less than or equal to 148 MHz, this out-of-range condition is detected by the PROM device 54 alone.

To facilitate an understanding of the role played by the logic circuitry 26 of FIG. 1, which is comprised by NAND gates 62 and 64 in the arrangement illustrated in FIG. 2A, in the detection of the above-mentioned first out-of-range condition, the following TABLES II and III are presented for respective NAND gates 62 and 64 which depict their logical operation at various critical counts and will be referred to during the explanation which follows hereafter.

TABLE II

| Frequency (No. of CKs) | NAND Gate 62, Inputs from: | | | NAND Gate 62 Output to NAND Gate 64 Input |
|---|---|---|---|---|
| | Output $Q_0$ of Counter 44 | Output $Q_3$ of Counter 42 | Output $Q_3$ of Counter 44 | |
| 143.99 | 0 | 1 | 1 | 1 |
| 144.00 | 1 | 0 | 1 | 1 |
| 144.01 | 1 | 0 | 1 | 1 |
| 148.00 | 1 | 0 | 1 | 1 |
| 148.01 | 1 | 0 | 1 | 1 |
| 151.99 | 1 | 0 | 1 | 1 |
| 152.00 | 1 | 1 | 1 | 0 |

TABLE III

| Frequency (No. of CKs) | NAND Gate 64, Inputs From: | | | NAND Gate 64 Output to $A_4$ Input of PROM 54 |
|---|---|---|---|---|
| | Output $Q_0$ of Counter 44 | Output of NAND 62 | Output $Q_3$ of Counter 44 | |
| 143.99 | 0 | 1 | 1 | 1 |
| 144.00 | 1 | 1 | 1 | 0 |
| 144.01 | 1 | 1 | 1 | 0 |
| 148.00 | 1 | 1 | 1 | 0 |
| 148.01 | 1 | 1 | 1 | 0 |
| 151.99 | 1 | 1 | 1 | 0 |
| 152.00 | 1 | 0 | 1 | 1 |

Also, during the explanation of out-of-range detection set forth hereafter, it will be necessary to frequently make reference to the program code which is contained in the PROM device 54 and presented below in TABLE IV.

TABLE IV

| | PROGRAM CODE FOR PROM 54 | | | | | | | | | | | |
|---|---|---|---|---|---|---|---|---|---|---|---|---|
| | From: | | | | | From: | | | | | | |
| Line No. | $Q_0$ of 42 to $A_0$ of 54 | $Q_1$ of 42 to $A_1$ of 54 | $Q_2$ of 42 to $A_2$ of 54 | $Q_7$ of 52 to $A_3$ of 54 | NAND 64 to $A_4$ of 54 | $Q_0$ of 54 to $A_4$ of 48, 50, 52 | $Q_1$ of 54 to Seg c of LED 60 | $Q_2$ of 54 to LED 24 | $Q_3$ of 54 to Seg b of LED 60 | $Q_4$ of 54 to Seg a of LED 60 | $Q_5$ of 54 to Seg d of LED 60 | LED 60 Display | VCO Freq. |
| 1 | 0 | 0 | 0 | 0 | 0 | 1 | 1 | 0 | 1 | 1 | 1 | Disabled | Out-of-Range |
| 2 | 1 | 0 | 0 | 0 | 0 | 1 | 1 | 0 | 1 | 1 | 1 | ↓ | |
| 3 | 0 | 1 | 0 | 0 | 0 | 1 | 1 | 0 | 1 | 1 | 1 | | Out-of-Range |
| 4 | 1 | 1 | 0 | 0 | 0 | 1 | 1 | 0 | 1 | 1 | 1 | ↓ | |
| 5 | 0 | 0 | 1 | 0 | 0 | 1 | 1 | 0 | 1 | 1 | 1 | Disabled | =148.00 |
| 6 | 1 | 0 | 1 | 0 | 0 | 1 | 0 | 1 | 0 | 0 | 1 | −1 | 149.00 |
| 7 | 0 | 1 | 1 | 0 | 0 | 0 | 0 | 1 | 1 | 1 | 0 | + | 150.XX |
| 8 | 1 | 1 | 1 | 0 | 0 | 0 | 0 | 1 | 0 | 0 | 0 | +1 | 151.XX |
| 9 | 0 | 0 | 0 | 1 | 0 | 1 | 1 | 0 | 1 | 1 | 1 | Disabled | Out-of-Range |
| 10 | 1 | 0 | 0 | 1 | 0 | 1 | 1 | 0 | 1 | 1 | 1 | ↓ | |
| 11 | 0 | 1 | 0 | 1 | 0 | 1 | 1 | 0 | 1 | 1 | 1 | ↓ | Out-of-Range |
| 12 | 1 | 1 | 0 | 1 | 0 | 1 | 1 | 0 | 1 | 1 | 1 | Disabled | |
| 13 | 0 | 0 | 1 | 1 | 0 | 1 | 0 | 1 | 0 | 0 | 1 | −1 | ≧148.01 |
| 14 | 1 | 0 | 1 | 1 | 0 | 1 | 0 | 1 | 1 | 1 | 1 | − | ≧149.01 |
| 15 | 0 | 1 | 1 | 1 | 0 | 0 | 0 | 1 | 1 | 1 | 0 | + | 150.XX |

TABLE IV-continued

PROGRAM CODE FOR PROM 54

| | From: | | | | | From: | | | | | | |
|---|---|---|---|---|---|---|---|---|---|---|---|---|
| Line No. | $Q_0$ of 42 to $A_0$ of 54 | $Q_1$ of 42 to $A_1$ of 54 | $Q_2$ of 42 to $A_2$ of 54 | $Q_7$ of 52 to $A_3$ of 54 | NAND 64 to $A_4$ of 54 | $Q_0$ of 54 to $A_4$ Seg c of 48, 50, 52 | $Q_1$ of 54 to Seg of LED 60 | $Q_2$ of 54 to LED 24 | $Q_3$ of 54 to Seg b of LED 60 | $Q_4$ of 54 to Seg a of LED 60 | 05 of 54 to Seg d of LED 60 | LED 60 Display | VCO Freq. |
| 16 | 1 | 1 | 1 | 1 | 0 | 0 | 0 | 1 | 0 | 0 | 0 | +1 | 151.XX |
| 17 | 0 | 0 | 0 | 0 | 1 | 0 | 1 | 0 | 1 | 1 | 1 | Disabled | Out-of-Range 75 |
| 18 | 1 | 0 | 0 | 0 | 1 | 0 | 1 | 0 | 1 | 1 | 1 | | |
| 19 | 0 | 1 | 0 | 0 | 1 | 0 | 1 | 0 | 1 | 1 | 1 | | |
| 20 | 1 | 1 | 0 | 0 | 1 | 0 | 1 | 0 | 1 | 1 | 1 | | |
| 21 | 0 | 0 | 1 | 0 | 1 | 0 | 1 | 0 | 1 | 1 | 1 | | |
| 22 | 1 | 0 | 1 | 0 | 1 | 0 | 1 | 0 | 1 | 1 | 1 | | |
| 23 | 0 | 1 | 1 | 0 | 1 | 0 | 1 | 0 | 1 | 1 | 1 | | |
| 24 | 1 | 1 | 1 | 0 | 1 | 0 | 1 | 0 | 1 | 1 | 1 | | |
| 25 | 0 | 0 | 0 | 1 | 1 | 0 | 1 | 0 | 1 | 1 | 1 | | |
| 26 | 1 | 0 | 0 | 1 | 1 | 0 | 1 | 0 | 1 | 1 | 1 | | |
| 27 | 0 | 1 | 0 | 1 | 1 | 0 | 1 | 0 | 1 | 1 | 1 | | |
| 28 | 1 | 1 | 0 | 1 | 1 | 0 | 1 | 0 | 1 | 1 | 1 | | |
| 29 | 0 | 0 | 1 | 1 | 1 | 0 | 1 | 0 | 1 | 1 | 1 | | |
| 30 | 1 | 0 | 1 | 1 | 1 | 0 | 1 | 0 | 1 | 1 | 1 | | |
| 31 | 0 | 1 | 1 | 1 | 1 | 0 | 1 | 0 | 1 | 1 | 1 | | Out-of-Range |
| 32 | 1 | 1 | 1 | 1 | 1 | 0 | 1 | 0 | 1 | 1 | 1 | Disabled | |

Referring first to TABLE III, it will be seen that a high state (represented by a one) on the output of NAND gate 64 at the end of a sampling period means that the actual VCO signal frequency is either less than 144 MHz or greater than or equal to 152 MHz and, thus, is out-of-range. As will be noted in the PROGRAM CODE FOR PROM 54 in TABLE IV, whenever the $A_4$ input to PROM device 54 is high (a one) due to the high output of NAND gate 64, the LED display unit 60 is disabled since all of the $Q_1$, $Q_3$, $Q_4$ and $Q_5$ outputs of the PROM device 54 providing the drive for the c, b, a and d segments of the display unit 60 are high (or ones). On the other hand, whenever the $A_4$ input of the PROM device 54 is high, the $Q_2$ output of the unit 54 is low (a zero) which drives the out-of-range LED display unit 24 (FIG. 1) so as to light the same.

The high state on the output of the NAND gate 64 is produced as follows. The three inputs to the NAND gate 62 are respectively connected to $Q_0$ and $Q_3$ outputs of the counter 44 and to the $Q_3$ output of the counter 42. The three inputs to the NAND gate 64 are respectively connected to the output of the NAND gate 62 and also to the $Q_0$ and $Q_3$ outputs of the counter 44. The output of the NAND gate 62 is also connected to PE parallel enable inputs of the counters 42 and 44. The output of NAND gate 62 goes low once the count of 15200 is reached by the counters 42 and 44 since at, and not before reaching, such count the $Q_0$ and $Q_3$ outputs of counter 44 and the $Q_3$ output of counter 42 are all high (ones), as is shown in TABLE I as well as TABLE II. This low output of NAND gate 62 is felt as a low by the PE inputs of the counters 42 and 44 and enables the continuous transfer of highs from the $P_0$ and $P_3$ inputs of the counter 44 to its $Q_0$ and $Q_3$ outputs and from the $P_3$ input of the counter 42 to its $Q_3$ output coincident with the arrival of subsequent clock pulses CK from counter 34. The counters are then cleared at the start of a succeeding sampling period. These connections insure that once the out-of-range (actually over range) condition is reached, such condition cannot be changed by the receipt of subsequent clock pulses CK, should such over range count of 15200 be reached before the end of the sampling period.

Also from TABLE III, it is seen that until a count of 14400 is reached the output of the NAND gate 64 is high even though the output of the NAND gate 62 is high. This is because at any count of less than 14400, the $Q_0$ and $Q_3$ outputs of the counter 44 are never both high at the same time, as can be inferred from TABLE I. Therefore, if the count reached at the end of a sampling period is less than 14400, the output of the NAND gate 64 will be high and correspondingly the $A_4$ input to PROM device 54 is high which disables the display unit 60 and drives the out-of-range display unit 24 to light due to the low $Q_2$ output of the PROM device 54.

In summary, a count of less than 14400 or greater than or equal to 15200 is detected by the logic circuitry 26 (FIG. 1) comprised by the NAND gates 62 and 64 in FIG. 2A and decoded by the PROM device 54 so as to disable display unit 60 and to light an out-of-range indication on the display unit 24.

Even though the output of the NAND gate 64 is low when the count is within a range equal to or greater than 14400 but less than 15200, that does not mean that the VCO signal frequency being monitored is within the desired predetermined range of ±1.99 MHz of the desired center frequency of 150 MHz. In fact, should the actual frequency fall within the range of equal to or greater than 144 MHz but less than or equal to 148 MHz, an out-of-range low state is produced at the $Q_2$ output of the PROM device 54, without the assistance of the logic circuitry 26, being decoded upon sensing certain states or levels on the $Q_0$, $Q_1$ and $Q_2$ outputs of the counter 42, as seen on lines 1 through 5 and 9 through 12 in TABLE IV. To prove that the particular output state of the NAND gate 64 of logic circuitry 26 exercises no influence on the manner in which the PROM device 54 decodes the specific $Q_0$, $Q_1$ and $Q_2$ output states of the counter 42 as shown on the above mentioned lines of TABLE IV, it will be noted that on lines 17 through 21 and 25 through 28, the $Q_0$, $Q_2$ output states are identical respectively to those shown on lines 1 through 5 and 9 through 12 but that the output of the NAND gate 64 is in an opposite state. However, the count inputs to the PROM device 54 are decoded as being out-of-range.

Therefore, even if the output of the NAND gate 64 is low, an out-of-range condition will be decoded as present if the decimal equivalent of the binary number represented by the $Q_0$, $Q_1$ and $Q_2$ outputs of the counter 42 (which outputs are felt respectively at the $A_0$, $A_1$ and $A_2$ inputs of the PROM device 54) is less than five, with one exception, that being when the $Q_7$ output of the PROM device 52 (which is being felt at the $A_3$ input of the PROM device 54) is high which indicates that the decimal fraction part of the total frequency count is not equal to 0.00. In other words, the total count is reflecting a frequency of 148.01 MHz or greater. Compare the states of the $Q_0$, $Q_1$, $Q_2$ outputs of the counter 42 and of the $Q_7$ output of the PROM device 52 and the decoding thereof by the PROM 54 on line 5 with those on line 13 in TABLE IV. When the $Q_7$ output of the PROM device 52 is low (or zero) the display unit 60 is disabled by the PROM device 54 because the frequency equals 148.00, while when the $Q_7$ output of PROM device 52 is high (or one) the display unit 60 is driven by the PROM device 54 to display a negative (−) one value because the frequency is equal to or greater than 148.01 (but less than 149.01).

It has just been explained how the presence of an out-of-range VCO signal frequency is detected and how such condition is caused to be indicated by the display unit 24. Now, the functioning of the PROM devices 48, 50, 52 and 54 will be explained when the actual VCO signal frequency is within the predetermined range of ±1.99 MHz from the desired center frequency of 150.00 MHz or is identical to it. The following TABLES V, VI and VII, which respectively illustrate the program code contained in PROM devices 48, 50 and 52, will be referred to throughout the discussion as will also be previously set forth TABLE IV which illustrates the program code in PROM device 54.

TABLE V

PROGRAM CODE FOR PROM 48

| Line No. | Decimal Count of 38 | From: $Q_0$ of 38 to $A_0$ of 48 | $Q_1$ of 38 to $A_1$ of 48 | $Q_2$ of 38 to $A_2$ of 48 | $Q_3$ of 38 to $A_3$ of 48 | $Q_0$ of 54 to $A_4$ of 48 | From: $Q_0$ of 48 to Seg a of LED 56 | $Q_1$ of 48 to Seg b of LED 56 | $Q_2$ of 48 to Seg c of LED 56 | $Q_3$ of 48 to Seg d of LED 56 | $Q_4$ of 48 to Seg e of LED 56 | $Q_5$ of 48 to Seg f of LED 56 | $Q_6$ of 48 to Seg g of LED 56 | $Q_7$ of 48 to E of 50 and to NAND 66 | LED 56 Display |
|---|---|---|---|---|---|---|---|---|---|---|---|---|---|---|---|
| 1 | 0 | 0 | 0 | 0 | 0 | 0 | 0 | 0 | 0 | 0 | 0 | 0 | 1 | 0 | 0 |
| 2 | 1 | 1 | 0 | 0 | 0 | 0 | 1 | 0 | 0 | 1 | 1 | 1 | 1 | 0 | 1 |
| 3 | 2 | 0 | 1 | 0 | 0 | 0 | 0 | 0 | 1 | 0 | 0 | 1 | 0 | 0 | 2 |
| 4 | 3 | 1 | 1 | 0 | 0 | 0 | 0 | 0 | 0 | 0 | 1 | 1 | 0 | 0 | 3 |
| 5 | 4 | 0 | 0 | 1 | 0 | 0 | 1 | 0 | 0 | 1 | 1 | 0 | 0 | 0 | 4 |
| 6 | 5 | 1 | 0 | 1 | 0 | 0 | 0 | 1 | 0 | 0 | 1 | 0 | 0 | 0 | 5 |
| 7 | 6 | 0 | 1 | 1 | 0 | 0 | 1 | 1 | 0 | 0 | 0 | 0 | 0 | 0 | 6 |
| 8 | 7 | 1 | 1 | 1 | 0 | 0 | 0 | 0 | 0 | 1 | 1 | 1 | 1 | 0 | 7 |
| 9 | 8 | 0 | 0 | 0 | 1 | 0 | 0 | 0 | 0 | 0 | 0 | 0 | 0 | 0 | 8 |
| 10 | 9 | 1 | 0 | 0 | 1 | 0 | 0 | 0 | 0 | 1 | 1 | 0 | 0 | 0 | 9 |
| 11 | 0 | 0 | 0 | 0 | 0 | 1 | 0 | 0 | 0 | 0 | 0 | 0 | 1 | 1 | 0 |
| 12 | 1 | 1 | 0 | 0 | 0 | 1 | 0 | 0 | 0 | 1 | 1 | 0 | 0 | 0 | 9 |
| 13 | 2 | 0 | 1 | 0 | 0 | 1 | 0 | 0 | 0 | 0 | 0 | 0 | 0 | 0 | 8 |
| 14 | 3 | 1 | 1 | 0 | 0 | 1 | 0 | 0 | 0 | 1 | 1 | 1 | 1 | 0 | 7 |
| 15 | 4 | 0 | 0 | 1 | 0 | 1 | 1 | 1 | 0 | 0 | 0 | 0 | 0 | 0 | 6 |
| 16 | 5 | 1 | 0 | 1 | 0 | 1 | 0 | 1 | 0 | 0 | 1 | 0 | 0 | 0 | 5 |
| 17 | 6 | 0 | 1 | 1 | 0 | 1 | 1 | 0 | 0 | 0 | 1 | 0 | 0 | 0 | 4 |
| 18 | 7 | 1 | 1 | 1 | 0 | 1 | 0 | 0 | 0 | 0 | 1 | 1 | 0 | 0 | 3 |
| 19 | 8 | 0 | 0 | 0 | 1 | 1 | 0 | 0 | 1 | 0 | 0 | 1 | 0 | 0 | 2 |
| 20 | 9 | 1 | 0 | 0 | 1 | 1 | 1 | 0 | 0 | 1 | 1 | 1 | 1 | 0 | 1 |

TABLE VI

PROGRAM CODE FOR PROM 50

| Line No. | Decimal Count of 40 | From: $Q_0$ of 40 to $A_0$ of 50 | $Q_1$ of 40 to $A_1$ of 50 | $Q_2$ of 40 to $A_2$ of 50 | $Q_3$ of 40 to $A_3$ of 50 | $Q_0$ of 54 to $A_4$ of 50 | From: $Q_0$ of 50 to Seg a of LED 58 | $Q_1$ of 50 to Seg b of LED 58 | $Q_2$ of 50 to Seg c of LED 58 | $Q_3$ of 50 to Seg d of LED 58 | $Q_4$ of 50 to Seg e of LED 58 | $Q_5$ of 50 to Seg f of LED 58 | $Q_6$ of 50 to Seg g of LED 58 | LED 58 Display |
|---|---|---|---|---|---|---|---|---|---|---|---|---|---|---|
| 1 | 0 | 0 | 0 | 0 | 0 | 0 | 0 | 0 | 0 | 0 | 0 | 0 | 1 | 0 |
| 2 | 1 | 1 | 0 | 0 | 0 | 0 | 1 | 0 | 0 | 1 | 1 | 1 | 1 | 1 |
| 3 | 2 | 0 | 1 | 0 | 0 | 0 | 0 | 0 | 1 | 0 | 0 | 1 | 0 | 2 |
| 4 | 3 | 1 | 1 | 0 | 0 | 0 | 0 | 0 | 0 | 0 | 1 | 1 | 0 | 3 |
| 5 | 4 | 0 | 0 | 1 | 0 | 0 | 1 | 0 | 0 | 1 | 1 | 0 | 0 | 4 |
| 6 | 5 | 1 | 0 | 1 | 0 | 0 | 0 | 1 | 0 | 0 | 1 | 0 | 0 | 5 |
| 7 | 6 | 0 | 1 | 1 | 0 | 0 | 1 | 1 | 0 | 0 | 0 | 0 | 0 | 6 |
| 8 | 7 | 1 | 1 | 1 | 0 | 0 | 0 | 0 | 0 | 1 | 1 | 1 | 1 | 7 |
| 9 | 8 | 0 | 0 | 0 | 1 | 0 | 0 | 0 | 0 | 0 | 0 | 0 | 0 | 8 |
| 10 | 9 | 1 | 0 | 0 | 1 | 0 | 0 | 0 | 0 | 1 | 1 | 0 | 0 | 9 |
| 11 | 0 | 0 | 0 | 0 | 0 | 1 | 0 | 0 | 0 | 1 | 1 | 0 | 0 | 9 |
| 12 | 1 | 1 | 0 | 0 | 0 | 1 | 0 | 0 | 0 | 0 | 0 | 0 | 0 | 8 |
| 13 | 2 | 0 | 1 | 0 | 0 | 1 | 0 | 0 | 0 | 1 | 1 | 1 | 1 | 7 |
| 14 | 3 | 1 | 1 | 0 | 0 | 1 | 1 | 1 | 0 | 0 | 0 | 0 | 0 | 6 |
| 15 | 4 | 0 | 0 | 1 | 0 | 1 | 0 | 1 | 0 | 0 | 1 | 0 | 0 | 5 |
| 16 | 5 | 1 | 0 | 1 | 0 | 1 | 1 | 0 | 0 | 0 | 1 | 0 | 0 | 4 |
| 17 | 6 | 0 | 1 | 1 | 0 | 1 | 0 | 0 | 0 | 0 | 1 | 1 | 0 | 3 |
| 18 | 7 | 1 | 1 | 1 | 0 | 1 | 0 | 0 | 1 | 0 | 0 | 1 | 0 | 2 |
| 19 | 8 | 0 | 0 | 0 | 1 | 1 | 1 | 0 | 0 | 1 | 1 | 1 | 1 | 1 |

TABLE VI-continued
PROGRAM CODE FOR PROM 50

| Line No. | Decimal Count of 40 | Q₀ of 40 to A₀ of 50 | Q₁ of 40 to A₁ of 50 | Q₂ of 40 to A₂ of 50 | Q₃ of 40 to A₃ of 50 | Q₀ of 54 to A₄ of 50 | Q₀ of 50 to Seg a of LED 58 | Q₁ of 50 to Seg b of LED 58 | Q₂ of 50 to Seg c of LED 58 | Q₃ of 50 to Seg d of LED 58 | Q₄ of 50 to Seg e of LED 58 | Q₅ of 50 to Seg f of LED 58 | Q₆ of 50 to Seg g of LED 58 | LED 58 Display |
|---|---|---|---|---|---|---|---|---|---|---|---|---|---|---|
| 20 | 9 | 1 | 0 | 0 | 1 | 1 | 0 | 0 | 0 | 0 | 0 | 0 | 1 | 0 |

TABLE VII
PROGRAM CODE FOR PROM 52

| Line No. | Decimal Count of 40 | Q₀ of 40 to A₀ of 52 | Q₁ of 40 to A₁ of 52 | Q₂ of 40 to A₂ of 52 | Q₃ of 40 to A₃ of 52 | Q₀ of 54 to A₄ of 52 | Q₀ of 52 to Seg a of LED 58 | Q₁ of 52 to Seg b of LED 58 | Q₂ of 52 to Seg c of LED 58 | Q₃ of 52 to Seg d of LED 58 | Q₄ of 52 to Seg e of LED 58 | Q₅ of 52 to Seg f of LED 58 | Q₆ of 52 to Seg g of LED 58 | Q₇ of 52 to A₃ of 54 | LED 58 Display |
|---|---|---|---|---|---|---|---|---|---|---|---|---|---|---|---|
| 1 | 0 | 0 | 0 | 0 | 0 | 1 | 0 | 0 | 0 | 0 | 0 | 0 | 1 | 0 | 0 |
| 2 | 1 | 1 | 0 | 0 | 0 | 1 | 0 | 0 | 0 | 1 | 1 | 0 | 0 | 1 | 9 |
| 3 | 2 | 0 | 1 | 0 | 0 | 1 | 0 | 0 | 0 | 0 | 0 | 0 | 1 | 1 | 8 |
| 4 | 3 | 1 | 1 | 0 | 0 | 1 | 0 | 0 | 0 | 1 | 1 | 1 | 1 | 1 | 7 |
| 5 | 4 | 0 | 0 | 1 | 0 | 1 | 1 | 1 | 0 | 0 | 0 | 0 | 1 | 1 | 6 |
| 6 | 5 | 1 | 0 | 1 | 0 | 1 | 0 | 1 | 0 | 0 | 1 | 0 | 0 | 1 | 5 |
| 7 | 6 | 0 | 1 | 1 | 0 | 1 | 1 | 0 | 0 | 1 | 1 | 0 | 0 | 1 | 4 |
| 8 | 7 | 1 | 1 | 1 | 0 | 1 | 0 | 0 | 0 | 0 | 1 | 1 | 0 | 1 | 3 |
| 9 | 8 | 0 | 0 | 0 | 1 | 1 | 0 | 0 | 1 | 0 | 0 | 1 | 0 | 1 | 2 |
| 10 | 9 | 1 | 0 | 0 | 1 | 1 | 1 | 0 | 0 | 1 | 1 | 1 | 1 | 1 | 1 |

As was mentioned above, the PROM device 48 decodes the count of the counter 38 to drive the LED display 56 to display the hundredths decimal place number of the frequency deviation magnitude. Either the PROM device 50 or the PROM device 52 decodes the count of the counter 40 to drive the LED display 58 to display the tenths decimal place number of the deviation magnitude. The PROM device 54 decodes the count of counters 42 and 44 to drive the LED display 60 to display the + or − indication and a one (1) indication if the magnitude of the deviation is that large. Also, the PROM device 54 supplies the sign indication to the PROM devices 48, 50 and 52 which affects the manner in which the PROM devices 48 and 50 will decode the count.

Specifically a positive (+) or negative (−) frequency deviation is indicated respectively by a low or high state of the $Q_0$ output of the PROM device 54 which is connected to the $A_4$ inputs to the PROM devices 48, 50 and 52.

Referring to TABLE V, it will be seen that when the $Q_0$ output of the PROM device 54 is low (or a zero), the PROM device 48 decodes its A input states so as to drive the LED display unit 56 to display a digit which is the decimal equivalent of the binary count on the Q outputs of the counter 38. Accordingly, a zero will be displayed if the binary count is zero, or a nonzero number falling within the range of one to nine will be displayed corresponding to the nonzero binary number count on the counter 38. On the other hand, when the $Q_0$ output of the PROM device 54 is high (or a one), the PROM device 48 decodes its A input states so as to drive the LED display unit 56 to display a digit which is the ten's complement of the decimal equivalent of the binary count on the Q outputs of the counter 38.

In FIG. 2B, it will be noted that the $Q_0$ through $Q_6$ outputs of the PROM device 50 are wire-OR'd with the corresponding outputs of the PROM device 52. These connected $Q_0$ through $Q_6$ outputs of PROM devices 50 and 52 are, in turn, connected to the segment a through g inputs to the LED display unit 58. Furthermore, the $A_0$ through $A_3$ inputs of the PROM devices 50 and 52 are connected respectively together and, in turn, connected to the $Q_0$ through $Q_3$ outputs of the counter 40. Therefore, the same count is sensed or felt at the $A_0$ through $A_3$ inputs of the PROM devices 50 and 52. Referring to TABLE VI, it will be seen that when the $Q_0$ output of the PROM 54 is low, the PROM device 50 decodes its A input states so as to drive the LED display unit 58 to display a digit which is the decimal equivalent of the binary count on the Q outputs of the counter 40. On the other hand, when the $Q_0$ output of the PROM device 54 is high, the PROM device 50, if it is enabled, decodes its A input states so as to drive the LED display unit 58 to display a digit which is the nine's complement of the decimal equivalent of the binary count on the Q outputs of the counter 40. Should the PROM device 52 be enabled instead of the PROM device 50 when the $Q_0$ output of the PROM device 54 is high, then the PROM device 52 decodes its A input states so as to drive the LED display unit 58 to display a digit which is the ten's complement of the decimal equivalent of the binary count on the Q outputs of the counter 40. The reason for the alternative use of the PROM device 52 instead of PROM device 50 will be described below. Suffice it to say for now that the state of the $Q_7$ output of the PROM device 48 determines which of the PROM devices 50 or 52 will be enabled or used.

With respect to the LED display unit 60 and the display of positive or negative signs thereon, from TABLE IV it will be seen that a low state (or zero) on the $Q_1$ output of the PROM device 54 causes the negative sign segment c of the unit 60 to light. However, if the output $Q_5$ of the PROM device 54 is also low, then the negative sign becomes a positive sign because the segments $d$ of the unit 60 are also caused to light. It is also seen in TABLE IV that the $Q_3$ and $Q_4$ outputs of the PROM device 54 will always either both be low or both be high. A low state on these latter outputs lights the number one (1) formed by segments $a$ and $b$ of display unit 60. Also, from TABLE IV, it will be understood that if the frequency deviation is not out-of-range, then the $Q_0$ output of the PROM device 54 (the sign-indicating output connected to the other PROM devices 48, 50 and 52) will be high (indicating a negative sign) only when the $Q_1$ output of the PROM device 54 is low (lighting the negative sign segment $c$ on the display unit 60) and the $Q_5$ output of the PROM device 54 is high (not lighting the positive sign segment $d$ on the display unit 60). Conversely, the $Q_0$ output of the PROM device 54 will be low (indicating a positive sign) only when the $Q_1$ and $Q_5$ outputs of the device 54 are both low (lighting the positive sign formed by segments $c$ and $d$ of the display unit 60).

As mentioned above, the PROM device 52 is an extra one which is only enabled at certain times and the state of the $Q_7$ output of the PROM device 48 determines which of PROM devices 50 or 52 will be enabled. The rule followed is that whenever the deviation detected is negative and the hundredths decimal place number of the deviation is zero, the PROM device 52 is enabled. At all other instances, the PROM device 50 is enabled. Application of this rule can be demonstrated, for example, by comparing the operation of the PROM device 48 and a NAND gate 66 (FIG. 2B) when the count is 14901 (meaning 149.01 MHz) with that when the count is 14900 (meaning 149.00 MHz).

Distinction between a count of 14901 and 14900 is brought about by the $Q_7$ output state of the PROM device 48. As seen from TABLE V, the $Q_7$ output of the device 48 is always low (a zero) except whenever the deviation detected is negative (represented by a high at the $Q_0$ output of device 54 and the $A_4$ input of device 48) and the count sensed at the $A_0$ through $A_3$ inputs of the device 48 is zero (0000), as seen on line 11 in TABLE V. In the latter instance, the $Q_7$ output of the PROM device 48 goes high. When this happens the E input of the PROM device 50 goes high which disables the device 50. The $Q_7$ output of the device 48 is also connected to a NAND gate 66. The other input to the NAND gate 66 is already high, since it senses the $\overline{Q}$ output of the flip-flop 14 which is high during the period of an enable display pulse. Thus, all inputs to the NAND gate 66 are high, and so its output goes low. This low state is felt on the E input to the PROM device 52 as a low which enables it to drive the LED display unit 58, with the PROM device 50 now disabled.

Therefore, if the count from the counters 38, 40, 42 and 44 was 14900, meaning a frequency of 149.00 MHz and a deviation magnitude of $-1.00$, the PROM device 52 would correctly drive the LED display unit 58 to display zero tenths instead of nine tenths as would happen if the PROM device 50 was not disabled. (Compare line 11 in TABLE VI with line 1 in TABLE VII.) The same is true whenever the count is from 148.10 to 149.90 where the hundredths decimal place number is zero and the deviation sign is negative.

It should be noted here also, referring to line 1 of TABLE VII, that the state of the $Q_7$ output of the PROM device 52 is low only in this instance where the count is 14900, which low is felt at the $A_3$ input to the PROM device 54 and insures, referring to line 6 of TABLE IV, that the count is decoded by the device 54 so as to cause the display of a negative one ($-1$) on the display unit 60.

On the other hand when the hundredths decimal place number of the count is nonzero, for example in 149.01 where the deviation is $-.99$, the PROM device 52 is disabled because the low state at the $A_7$ output of the PROM device 48 makes the output of the NAND gate 66 high and the E input to the device 52 high. However, the low at the $A_7$ output of device 48 makes the E input of device 50 low which enables the latter. With PROM device 50 now enabled, and device 52 disabled, the LED display unit 58 is correctly driven to display the nine tenths number of the deviation.

It should also be mentioned at this point that the PROM devices 48 and 54 (and devices 50 and 52 through the device 48 and NAND gate 66) are disabled when the Q output of the flip-flop 14 goes high and its $\overline{Q}$ output goes low at the end of the period of a display pulse.

If the actual VCO signal frequency being monitored exactly equals the desired center frequency of 150 MHz, then the PROM devices 48, 50 and 54 respectively decode the count, as shown in TABLES V, VI and IV, and drive the LED display units 56, 58 and 60 to display a deviation of $+.00$, which means the deviation is zero.

One practical example of values for various resistances in the circuit 10 is indicated in FIGS. 2A and 2B and the $+V$ terminals are connected through a 1K ohm current limiting resistor (not shown) to a $+5$ volt power supply.

Having thus described the invention, what is claimed is:

1. A circuit for producing a digital display of the deviation of the actual frequency of an input signal from a preselected desired frequency, comprising:
   means for producing alternating sampling and display period pulses;
   means for receiving said input signal and said sampling and display pulses and producing, during the period of a sampling pulse, clock pulses at a rate proportional to the actual frequency of said incoming signal;
   counter means for receiving said clock pulses and counting the number thereof produced during the period of a sampling pulse, said counter means being operable to hold said count during the period of a display pulse succeeding said sampling pulse;
   digital display means; and
   means for sensing the count held by said counter means and decoding the same to drive said display means to digitally indicate, when within a predetermined range, the magnitude of deviation of the actual frequency of said incoming signal from the preselected desired frequency.

2. The circuit as recited in claim 1, further comprising:
   means for sensing the commencement of the next sampling pulse period for clearing the count being held by said counter means at the termination of the preceding display pulse period.

3. The circuit as recited in claim 1, wherein said means for sensing and decoding the count held by said counter means is operable to cause the display of an out-of-range indication when said magnitude of deviation is outside of said predetermined range.

4. The circuit as recited in claim 1, wherein said means for sensing and decoding the count held by said counter means is operable to drive said display means to indicate whether said magnitude of deviation of said actual frequency is positive or negative relative to said preselected desired frequency.

5. The circuit as recited in claim 1, wherein said means for sensing and decoding the count held by said counter means includes logic means for sensing when the count of said counter means exceeds the maximum positive magnitude of frequency deviation within said predetermined range whereupon said sensing and decoding means is operable to cause the display of an out-of-range indication.

6. The circuit as recited in claim 1, wherein said digital display means includes a plurality of units, a first of said units being driven by said count sensing and decoding means to display a digit representing the hundredths decimal place number of the deviation magnitude, a second of said units being driven to display a digit representing the tenths decimal place number of the deviation magnitude, and a third of said units being driven to display the sign of said deviation magnitude as well as a digit representing the ones unit, if any, of said deviation magnitude.

7. The circuit as recited in claim 1, wherein said count sensing and decoding means includes a plurality of read only memory devices for sensing and decoding separate portions of said count held by said counter means.

8. The circuit as recited in claim 7, wherein one of said read only memory devices decodes a portion of said count so as to determine the sign of said deviation magnitude and other of said read only memory devices are responsive to the sign determined by said one device so as to decode their respective count portions in a first predetermined form if the sign is positive and in a second predetermined complementary form if the sign is negative.

9. A circuit for producing a digital display of the deviation of the actual frequency of an input signal from a preselected desired frequency, comprising:
means for producing alternating sampling and display period pulses;
means for receiving said input signal and said sampling and display pulses and producing, during the period of a sampling pulse, clock pulses proportional to the actual frequency of said incoming signal, said clock pulse producing means being disabled during the period of a display pulse;
counter means for receiving said clock pulses and counting the number thereof produced during the period of a sampling pulse, said counter means being operable to hold said count during the period of a display pulse succeeding said sampling pulse;
means for receiving said sampling and display period pulses for clearing, after the start of a sampling pulse period, the count being held by the counter means at the end of the preceding display pulse period;
display means; and
means for receiving said sampling and display pulses and sensing, during the period of a display pulse, the count held by said counter means which was reached thereby at the end of the preceding sampling pulse period, said sensing means operable to decode said count and drive said display means so as either to display the magnitude and sign of the deviation of the actual frequency of said incoming signal from the preselected desired frequency when said deviation is within a predetermined range or to display an out-of-range indication, said sensing means being disabled during the period of a sampling pulse.

* * * * *

UNITED STATES PATENT AND TRADEMARK OFFICE
CERTIFICATE OF CORRECTION

PATENT NO. : 4,123,704

DATED : October 31, 1978

INVENTOR(S) : Kenneth C. Johnson

It is certified that error appears in the above-identified patent and that said Letters Patent are hereby corrected as shown below:

Column 8, TABLE IV, line 4 of TABLE IV, "05" should be -- $Q_5$ --.

Column 9, TABLE IV-continued, line 4 of TABLE IV-continued, "05" should be -- $Q_5$ --.

Column 9, TABLE IV-continued, line 16, of TABLE IV-continued "75" should be -- ↓ --.

Column 10, line 61, "$Q_0$, $Q_{2,,}$ should be -- $Q_0$, $Q_1$ and $Q_2$ --.

Columns 1 and 12, line 13 of TABLE V which reads:

"Line ofof of of of LED LED LED LED LED LED LED NAND    56"

should read:

-- Line of of of of of LED LED LED LED LED LED LED NAND 56 --.

Signed and Sealed this

Second Day of October 1979

[SEAL]

Attest:

RUTH C. MASON
*Attesting Officer*

LUTRELLE F. PARKER
*Acting Commissioner of Patents and Trademarks*